United States Patent [19]

Herberich et al.

[11] Patent Number: 4,719,694

[45] Date of Patent: Jan. 19, 1988

[54] INSTALLATION FOR AUTOMATIC ASSEMBLY AND TESTING OF ELECTRONIC CARD MODULES

[75] Inventors: Wolfgang Herberich, Koenigsbrunn; Walter Degle, Bobingen; Heiner Bahnsen, Bocholt; Olaf-Ragnar Bolzmann, Augsburg, all of Fed. Rep. of Germany

[73] Assignee: Siemens Aktiengesellschaft, Berlin and Munich, Fed. Rep. of Germany

[21] Appl. No.: 930,645

[22] Filed: Nov. 13, 1986

[30] Foreign Application Priority Data

Nov. 13, 1985 [DE] Fed. Rep. of Germany ....... 3540316

[51] Int. Cl.$^4$ .................. B23P 21/00; B23Q 15/00
[52] U.S. Cl. .................................... 29/703; 29/33 K; 29/711; 29/742; 29/771; 29/791; 29/822; 198/341; 198/570; 414/136; 414/222; 414/273
[58] Field of Search ............... 29/701, 703, 822, 823, 29/824, 711, 729, 742, 771, 791, 33 K; 198/339.1, 341, 435, 436, 570; 414/134, 136, 222, 273

[56] References Cited

U.S. PATENT DOCUMENTS

| | | | |
|---|---|---|---|
| 3,627,153 | 12/1971 | Brummett | 414/134 |
| 3,796,327 | 3/1974 | Meyer et al. | 29/703 X |
| 4,069,764 | 1/1978 | Teyssedre | 198/339.1 |
| 4,309,600 | 1/1982 | Perry et al. | 29/703 X |
| 4,369,563 | 1/1983 | Williamson | 29/703 X |
| 4,397,384 | 8/1983 | Nohren, Jr. | 198/341 |
| 4,538,950 | 9/1985 | Shiomi et al. | 414/222 |
| 4,561,060 | 12/1985 | Hemond | 198/341 X |
| 4,564,102 | 1/1986 | Mori et al. | 414/134 X |
| 4,579,499 | 4/1986 | Mikes | 414/273 |
| 4,630,216 | 12/1986 | Tyler et al. | 198/341 |

FOREIGN PATENT DOCUMENTS 164563 12/1985 European Pat. Off. .

Primary Examiner—Howard N. Goldberg
Assistant Examiner—Ronald S. Wallace
Attorney, Agent, or Firm—Hill, Van Santen, Steadman & Simpson

[57] ABSTRACT

A production facility is provided for automatic assembly and testing of electronic card modules. Heretofore it has only been possible to manufacture card modules in batches without a quick conversion to another type of production, as required, being economically possible. This disadvantage is avoided by the present invention in that all required operating elements (component parts, tools, automatic assembly and testing units) are controlled in direct access with set-up time approaching zero for the production line via an extensive computer hierarchy in which the assembly and test line are available. A master computer administers the cell computers assigned to the individual processing stations which, in turn, control the machine computers. The conveying system has its own control available. The individual parts of the conveying system are each composed of a route head for transferring the equipped goods to process-associated workpiece carriers with simultaneous application of the respectively first destination address for the purpose of delivery to the individual processing stations by way of switches.

3 Claims, 3 Drawing Figures

INSTALLATION FOR AUTOMATIC ASSEMBLY AND TESTING OF ELECTRONIC CARD MODULES

BACKGROUND OF THE INVENTION

1. Field of the Invention

The present invention relates to a production installation for automatic assembly and testing of electronic card modules utilizing automatic program-controlled equipping, soldering and testing units, as well as a mechanical conveyor system, whereby a plurality of identical processing stations are respectively combined to form what are referred to as cells, whereby the control of the discrete parts such as, for example, printed circuitboards, components or mechanical parts, occurs by way of a master computer in cooperation with cell computers assigned to each cell and with the assistance of identifiers that can be applied to the discrete parts.

2. Description of the Prior Art

The reduction of inventories, increase of quality and avoidance of technically and dispositionally caused re-equipping or, respectively, wasting, is a significant contribution to increasing productivity. This is particularly true of the production of electronic systems which are fabricated upon assembly of high-quality components. The points of emphasis of such operations are the card module fabrication and testing.

Inventory costs are caused by run stocks (directly dependent on the throughput time) and module warehouse stocks of completely-tested card modules which cannot yet be called in by the following systems assembly because the type of structure is not yet complete. Reprocessing costs are reduced by the desired manufacturing quality of greater than 95% error-free card modules before the first test. Re-equipping and waste costs are caused by card modules which are no longer required after fabrication as a consequence of different disposition or, respectively, which are technically antiquated at the point in time they are needed. The risk is directly dependent on the overall running time.

It is known in the art to manufacture card modules in batches, whereby the reason for batching is that the equipping and testing machines must be specially equipped for the fabrication of a specific type of card module. Included in the set-up event is supplying the machines with material (components) and with the information sets which define the work sequence. Since the set-up time is currently relatively high in comparison to the actual manufacturing process, an attempt must be made to successively manufacture the greatest possible number of identical types of card modules after the exertion of a set-up time (batching). Card module production facilities which are known in the art manufacture the required spectrum of card module types and quantities in a cycle of, for example, a number of weeks, and output the quantity to a card module warehouse from which the following assembly works can selectively take the card modules. This buffer warehouse is necessary in order to keep enough items of a specific card module type on hand because this same type will not be manufactured again until after the time interval of a number of weeks.

The batches combine the requirements of a period of the systems assembly (for example, month). The production and test facilities must be newly established for each batch. A batch is only forwarded to the following production step when the last unit is processed. The combination of card modules of the same type is a compulsory necessity in order to maintain the set-up time in a justifiable relationship to the production time. All known activities attempt a gradual improvement of the current condition without departing from the basic condition of batching. A throughput time on the order of magnitude of, for example, two weeks for the card module fabrication (from calling in the material up to the finished electrical test) seems to be a natural lower limit. However, this value can only be achieved when the batch size is reduced down to the limit at which the set-up expense becomes no longer economically justifiable due to its exponential increase (batch sizes of 15-20 items).

The German patent application No. P 34 18 210, as well as European patent application No. 85105522.8 (publication No. 164,563-A1; Dec. 18,1985 ) discloses a method for set-up free fabrication of card modules without the necessity of batching wherein the production process is largely automated. The components required for assembly (equipping and soldering), on the one hand, and the information sets both for the assembly and for the testing of individual card module units are situated in random access of the assembly and testing station. The assembly and testing stations themselves are computer-guided facilities, whereby the transport of the products from station-to-station is additionally guided by further computers (cell computers) and the overall production process, beginning from the input of the printed circuitboard up to the delivery of the completely-equipped, tested card module to the further processing department is coordinated by a master computer, which is again overlaid on the self computer.

SUMMARY OF THE INVENTION

The object of the present invention is to provide a production facility comprising suitable conveying systems for the above-specified method for the automatic assembly and testing of electronic card modules.

The production facility is fashioned, according to the present invention, such that the first part of the conveying system is composed of two separate, horizontal endless belts preferably arranged above one another for the separate conveying of printed circuitboards or, respectively, card modules and components to be equipped therewith, having processing stations that are lateral in the conveying direction and can be reached by way of switched controlled by the master computer. The facility also comprises a first route head on which the printed circuitboards can be applied to a workpiece carrier for equipping provided with a first destination address, whereby each processing station includes means by way of which the destination address which has been reached can be erased and the respectively new destination address can be applied. The component parts, in addition, can be provided with the destination address either individually or in batches at the first route head. Buffers for the deposit of incoming printed circuitboards or, respectively, card modules to be equipped and components are provided in the processing stations. A second route head is provided at which the partially-equipped card modules are transferable onto a second work piece carrier for soldering which takes over the last destination address, proceeding from which they are supplied to the second part of the conveying system which leads to the soldering stations. The facility further comprises one or more conveyor belts arranged side-by-side. A third route head is provided at which the partially-equipped card modules coming from the soldering station are transferred onto a third workpiece carrier for testing purposes and are supplied to the final assembly and testing stations on a third part of the conveying system which is composed of a continuous belt arranged in a single plane.

According to a feature of the invention, the first part of the conveying system is composed of endless belts arranged above one another for the transport of printed circuitboards or, respectively, card modules, having processing stations at the side in the conveying direction which can be reached via switches controlled by the master computer, and is also composed of a first route head at which the printed circuitboards can be applied to a first workpiece carrier for equipping which is provided with a first destination address, whereby each processing station includes means by way of which the destination address reached can be erased and the respective new destination address can be applied. Buffers are provided for the deposits of incoming printed circuitboards or, respectively, card modules to be equipped and component parts, in the processing stations. The component parts proceed to the individual processing stations via a driverless conveying system. A second route head is provided at which the partially-equipped card modules can be transferred onto a second workpiece carrier for soldering which takes over the last destination address, proceeding from which they are supplied to the second part of the conveying system which leads to the soldering station and is composed of one or more conveyor belts arranged side-by-side. A third route head is provided at which the equipped card modules coming from the soldering stations are transferred onto a third workpiece carrier for testing purposes and are supplied to the final assembly and testing stations on the third part of the conveying system which is composed of a horizontally arranged endless belt.

By way of the above measures, a production facility is established for a set-up free manufacture of card modules without the necessity of batching.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
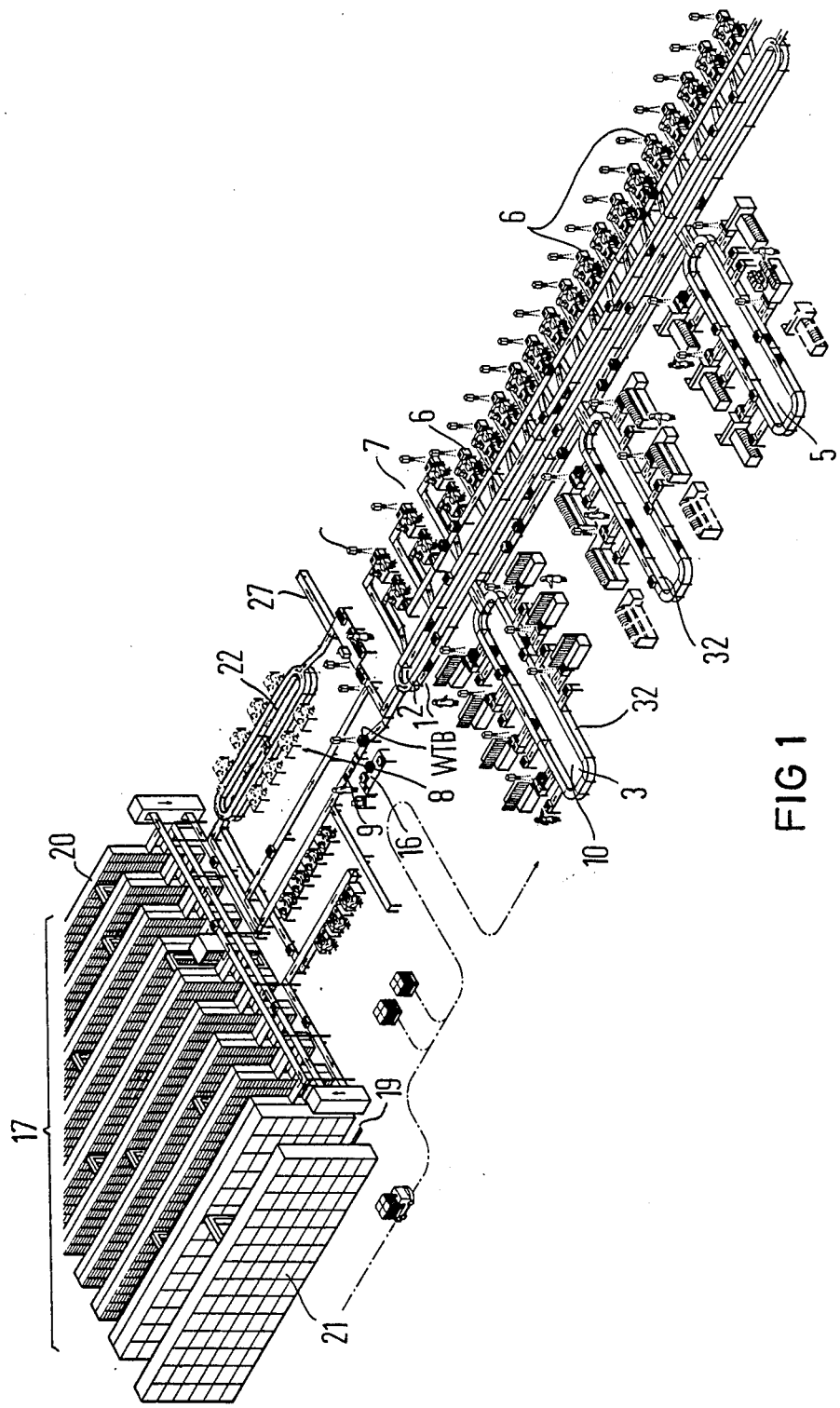
FIG. 1 is a pictorial representation of a first conveying system comprising a route head for the second part of the conveying system.

Referring to FIG. 1, all parts required for the production of a card module are supplied to a first route head 8. Both the printed circuit cards and the workpiece carriers WTB are brought to a printed circuitboard and workpiece carrier buffer location 16 via a controlled or, respectively, controllable, driverless conveying device FTS, the printed circuitboards 9 being applied to the workpiece carriers WTB at the location 16. One or, given multiple occupation, a plurality of printed circuitboards, can thereby be arranged on a workpiece carrier WTB. The alignment and coding of the respective workpiece carrier WTB is carried out at this location at the same time.

The warehouse 17 comprises a plurality of shelving units having intervening warehouse lanes 19. Shelving units 20 are thereby provided for storage of small parts and shelving units 21 are provided for the storage of palettes. Depending on need, either discrete small parts or palettes already equipped with small parts which are sorted for specific types of card modules are called out of the warehouse and are transported in computer-controlled fashion to the components preparation locations 22 via respective conveyor belts. The individual component parts for the manual equipping operation are prepared at the components preparation locations 22 and are then forwarded in a computer-controlled manner to the respective processing stations sorted in containers.

The first part of the conveying system for the production facility for automatic production and testing of electronic card modules is composed of two endless belts 1, 2 arranged one above the other. The discrete component parts or, respectively, the component parts sorted to form batches are thereby conveyed to the respective processing stations in the upper level 1, whereas the workpiece carriers WTB equipped with the printed circuitboards 9 likewise proceed to the processing stations 3, 4, 5 in the lower level 2. These processing stations are combined to form individual cells which are laterally arranged next to the main conveyor belts 1, 2 and in which each cell, in turn, contains two endless conveyor belts 32 arranged one above the other at which the individual processing machines are arranged. When more components are, respectively, workpiece carriers with printed circuitboards are delivered then can be governed at the moment by the machines, then these can be transferred out onto a buffer 10. The drawing illustrates three cells arranged following one another in the conveying direction, whereby the first cell 3 is equipped with automatic dual inline package units, second cell 4 is equipped with axial equipping machines and the third cell 5 is equipped with radial and special equipping machines. The supplying of the individual machines with component parts provides for delivery thereof in the carrier unit which is provided with a destination coding, as already set forth above. As needed, the destination coding directs the carrier units to the equipping machines. Subsequent thereto, the partially-equipped card modules, together with the workpiece carrier WTB, proceed to a further route head 6 which has two tasks to carry out. The first task provides that parts which cannot be equipped in a mechanized fashion are manually applied to the card modules and, subsequently, the transfer from the workpiece carrier WTB for equipping onto a second workpiece carrier WTL for the soldering process is undertaken. A special equipping cell 7 for data display stations is also arranged following the route head 6.

Figure 2:
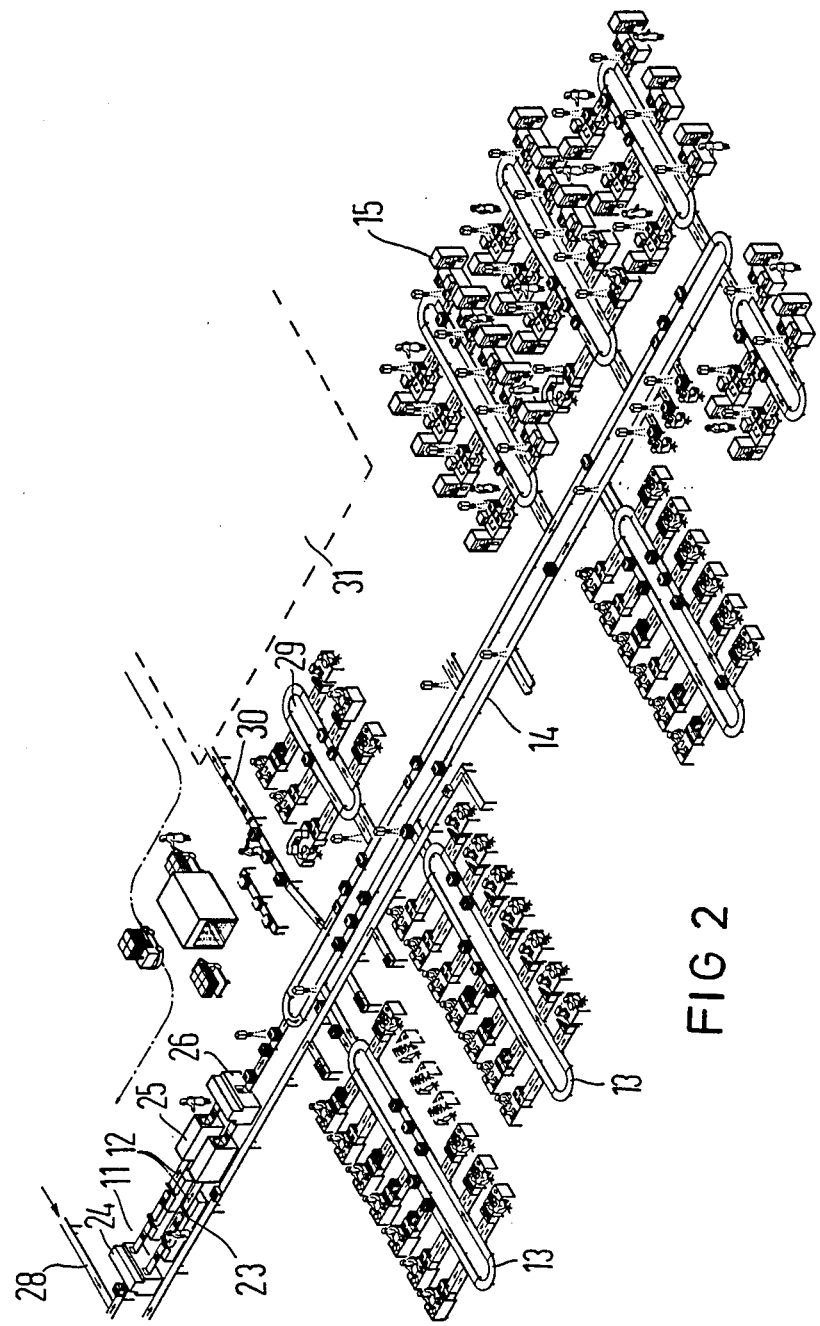
FIG. 2 is a pictorial representation of the second and third parts of the first conveying system.

Proceeding from the route head 6, the transfer card modules, as illustrated in FIG. 2, proceed on a further conveyor belt to the automatic soldering units 23 which can be multiply provided. The incoming card module stack is thereby first unstacked in the apparatus 24, is subsequently colophonated and soldered and is then supplied to an automatic washing unit 25 which is followed by a stacking apparatus 26. The card modules therefore provided in stacks now proceed to a third route head 13 which, in turn, has two tasks to carry out.

First of all, the final assembly of the card modules is undertaken at the route head 13 and, subsequently, the card modules are transferred onto a third workpiece carrier WTB for testing purposes. After this, they are supplied to the third part of a conveying structure which is composed of a third endless belt 14 running side-by-side at whose sides cells are again arranged, these likewise being equipped with endless belts at which, however, automatic testing units 15 for the individual test procedures are constructed. After the last functional check, the assemblies found to be in proper working order proceed to the apparatus assembly 31 via a conveyor belt 30, whereby faulty card modules are repaired in a diagnosis and repair station 29 and are subsequently likewise conducted to the apparatus assembly 31 via the conveyor belt 30.

Further conveying systems can be provided parallel to the conveying system set forth above, whereby the branching 27 is indicated at the first route head 8. For the soldering process, the card modules equipped in parallel are then conducted to the common automatic soldering units 23, whereby the feed 28 of these card modules occurs preceding the destacking unit 24 shown in FIG. 2.

Figure 3:
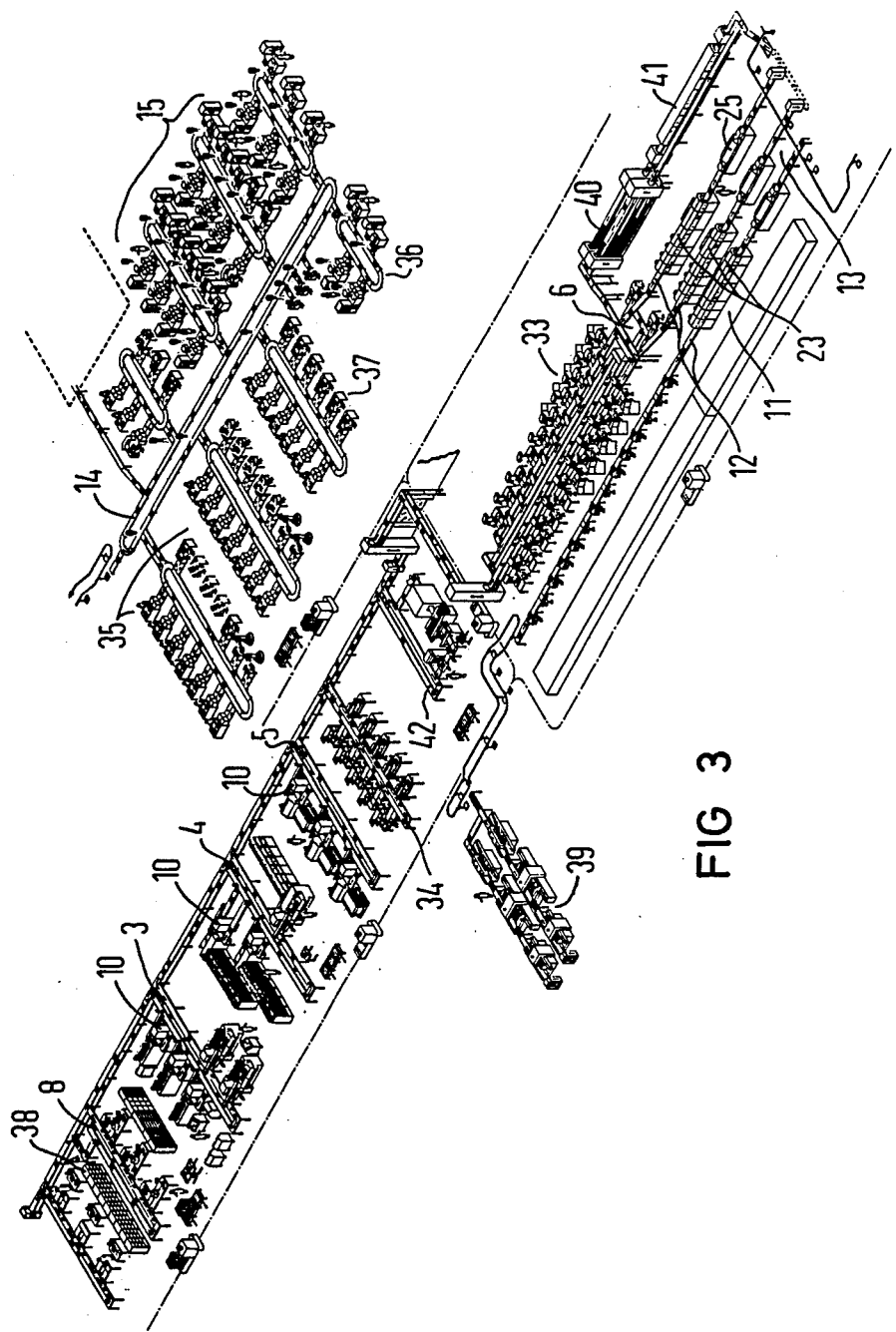
FIG. 3 is a pictorial representation of a second conveying system.

FIG. 3 illustrates a further possibility of formating a fabrication facility for the automatic assembly and testing of electronic card modules. The first part of the facility is composed of an endless belt arranged to run over the top of itself with the forward direction in the upper level and the return direction in the lower level. After the special cell 38, the printed circuitboards 9 which are still unequipped are applied to the workpiece carrier WTB for the equipping at the first route head 8 and are provided with an appropriate coding. Components having dual in-line housings are assembled in the processing station 3. Axial components are assembled in the following processing station 4. Radial components are assembled following thereupon in the processing station 5. After a pre-assembly cell 34 for special equipping and a potential, further equipping with unwired components in the cell 42, the partially-equipped card modules proceed by way of a manual equipping station 33 at which the elements which cannot be automatically applied are applied to the second route head 6 where they are taken from the workpiece carrier for components WTB and are re-applied to a workpiece carrier WTL which are suitable for soldering. Subsequently, the equipped printed circuitboard 9 are conducted through the soldering cells 11 which contain a plurality of soldering stations 23 and which are connected by way of the belts 12 to a second route head 6 and to the manual equipping locations 33. Also belonging to the soldering cell 11 are the wash and brush stations 25 which follow the individual automatic soldering units. The store 40 for the workpiece carriers for soldering is also located in the proximity of the automatic soldering units, these workpiece carriers being cleaned after use by way of their own washing system 41.

The printed circuitboards which have now been equipped and soldered are conducted to automatic testing units 15 in a third section. The automatic testing units are likewise, in turn, combined to form cells and are managed via an endless belt 14 running side-by-side. Endless belts which again run horizontally are likewise arranged in the cells themselves. Before the testing, the individual modules must still be conducted through the final assembly 35, a cell for the auxiliary winding 37, and by way of an integrated circuit test cell 36. A further cell 39 is provided for customized models.

Supplying the individual stations with components and with component parts is assured by way of a driverless conveying system FTS.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a production facility for automatic assembly and testing of different types of electronic card modules manufactured from elements including circuitboards and electrical components, using automatic program-controlled equipping, soldering and testing units cooperatively arranged with a conveyor system, in which a plurality of processing stations are combined to form cells, and in which the control of the elements occurs via a master computer in cooperation with cell computers in the cells and with identifiers which are applied to the elements, the improvement wherein:

the conveyor system comprises first, second and third parts, said first part for conveying printed circuitboards and electrical components;

the processing stations are arranged along said first part of said conveyor system;

switches are arranged along said first part of said conveyor system at the processing stations and are controlled by the master computer to direct the elements to and from the processing stations;

a first route head is located upstream of and in communication with said first part of said conveyor system for applying the circuitboards to a respective first workpiece carrier bearing a destination address and applying destination addresses to the electrical components;

individual driverless conveyors communicating said processing stations, via said switches, with said first part of said conveyor system;

means are provided at each processing station for reading the destination addresses and applying the next destination addresses;

buffers are provided at the respective processing stations for temporarily storing incoming elements;

a soldering station is spaced from said first conveyor part, the second part of the conveyor system extending through said soldering station;

a second route head is provided for transferring the partially-equipped card modules from the workpiece carrier on the first conveyor part onto a second workpiece carrier on the second conveyor part for soldering in response to the last-applied destination address;

a final assembly and test station is spaced from said soldering station; and the third part of the conveyor system comprises an endless belt located between and transporting the card modules from the soldering station to the final assembly and test station.

2. In a production facility for automatic assembly and testing of different types of electronic card modules manufactured from elements including circuitboards and electrical components, using automatic program-controlled equipping, soldering and testing units cooperatively arranged with a conveyor system, in which a plurality of processing stations are combined to form cells, and in which the control of the elements occurs via a master computer in cooperation with cell computers in the cells and with identifiers which are applied to the elements, the improvement wherein:

the conveyor system comprises first, second and third parts, said first part including an endless belt with forward and reverse running direction sections arranged one above the other for conveying printed circuitboards and electrical components;

the processing stations are arranged along said endless belt;

switches are arranged along said belt at the processing stations and are controlled by the master computer to direct the elements to and from the processing stations;

a first route head is located upstream of and in communication with said belt for applying the circuitboards to a respective first workpiece carrier bearing a destination address and applying destination addresses to the electrical components;

means are provided at each processing station for reading the destination addresses and applying the next destination addresses;

buffers are provided at the respective processing stations for temporarily storing incoming elements;

a soldering station is spaced from said first conveyor part, the second part of the conveyor system comprising at least one belt extending through said soldering station;

a second route head is provided for transferring the partially-equipped card modules from the workpiece carrier on the first conveyor part onto a second workpiece carrier on the second conveyor part for soldering in response to the last-applied destination address;

a final assembly and test station is spaced from said soldering station; and the third part of the conveyor system comprises an endless belt located between and transporting the card modules from the soldering station to the final assembly and test station.

3. In a production facility for automatic assembly and testing of different types of electronic card modules manufactured from elements including circuitboards and electrical components, using automatic program-controlled equipping, soldering and testing units cooperatively arranged with a conveyor system, in which a plurality of processing stations are combined to form cells, and in which the control of the elements occurs via a master computer in cooperation with cell computers in the cells and with identifiers which are applied to the elements, the improvement wherein:

the conveyor system comprises first, second and third parts, said first part including two horizontal endless belts arranged one above the other for respectively conveying printed circuitboards and electrical components;

the processing stations are arranged along said two horizontal endless belts;

switches are arranged along said belts at the processing stations and are controlled by the master computer to direct the elements to and from the processing stations;

a first route head is located upstream of and in communication with said belts for applying the circuitboards to a respective first workpiece carrier bearing a destination address and applying destination addresses to the electrical components;

means are provided at each processing station for reading the destination addresses and applying the next destination addresses;

buffers are provided at the respective processing stations for temporarily storing incoming elements;

a soldering station is spaced from said first conveyor part, the second part of the conveyor system extending through said soldering station;

a second route head is provided for transferring the partially-equipped card modules from the workpiece carrier on the first conveyor part onto a second workpiece carrier on the second conveyor part for soldering in response to the last-applied destination address;

a final assembly and test station is spaced from said soldering station; and the third part of the conveyor system comprises an endless belt located between and transporting the card modules from the soldering station to the final assembly and test station.

* * * * *